United States Patent [19]

Matsumoto

[11] Patent Number: 5,610,831
[45] Date of Patent: Mar. 11, 1997

[54] SEMICONDUCTOR ELEMENT LAYOUT METHOD EMPLOYING PROCESS MIGRATION

[75] Inventor: Nobu Matsumoto, Kanagawa-ken, Japan

[73] Assignee: Kabushiki Kaisha Toshiba, Kawasaki, Japan

[21] Appl. No.: 334,064

[22] Filed: Nov. 4, 1994

[30] Foreign Application Priority Data

Nov. 5, 1993 [JP] Japan ................................ 5-276735

[51] Int. Cl.$^6$ ............................ G06F 15/00; G03F 9/00; H01L 21/70
[52] U.S. Cl. .................... 364/491; 364/488; 364/489; 364/490; 430/5; 430/22; 430/311; 430/315; 437/50; 437/47; 437/51; 437/190
[58] Field of Search ................................ 364/488, 489, 364/490, 491; 437/34, 57, 192, 50, 47, 51; 430/5, 2, 311, 315; 327/91, 94, 170; 257/379, 382

[56] References Cited

U.S. PATENT DOCUMENTS

| | | | |
|---|---|---|---|
| 4,910,168 | 3/1990 | Tsai | 437/193 |
| 4,952,522 | 8/1990 | Yamada et al. | 437/34 |
| 5,018,074 | 5/1991 | Griffith et al. | 364/490 |
| 5,019,534 | 5/1991 | Tsai et al. | 437/200 |
| 5,097,422 | 3/1992 | Corbin, II et al. | 364/489 |
| 5,225,993 | 7/1993 | Inatsuki et al. | 364/490 |
| 5,247,455 | 9/1993 | Yoshikawa | 364/488 |
| 5,253,182 | 10/1993 | Suzuki | 364/489 |
| 5,369,596 | 11/1994 | Tokumaru | 364/491 |
| 5,381,343 | 1/1995 | Bamji et al. | 364/489 |
| 5,416,722 | 5/1995 | Edwards | 364/490 |
| 5,477,467 | 12/1995 | Rugg | 364/491 |

OTHER PUBLICATIONS

Dao et al., "A Compaction Method for Full Chip VLSI Layouts", 30th ACM/IEEE Design Automation Conference, (1993), pp. 407–412.

*Primary Examiner*—Kevin J. Teska
*Assistant Examiner*—Jacques Louis-Jacques
*Attorney, Agent, or Firm*—Foley & Lardner

[57] ABSTRACT

A semiconductor element layout method carries out process migration to convert a first mask layout prepared for integrated circuits according to a first design rule into a second mask layout that follows a second design rule. The process migration selectively removes substrate contacts that are present between adjacent elements on the first mask layout.

20 Claims, 6 Drawing Sheets

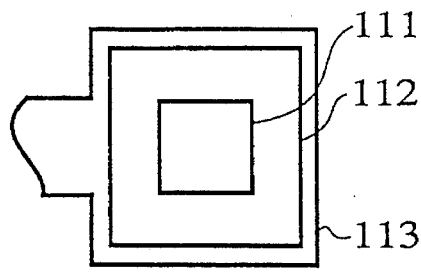 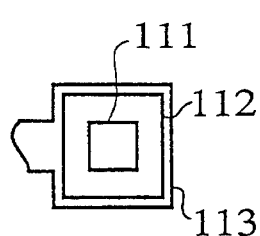 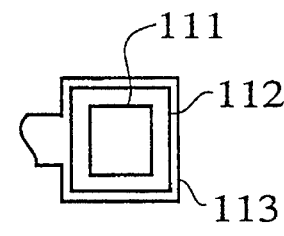
FIG.1A PRIOR ART   FIG.1B PRIOR ART   FIG.1C PRIOR ART
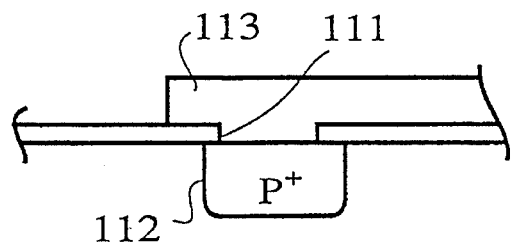
FIG.2 PRIOR ART
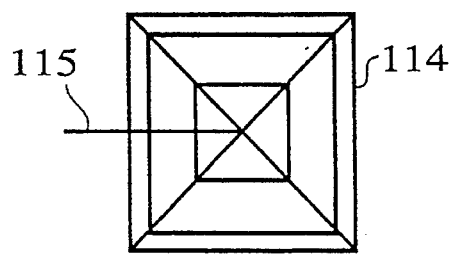 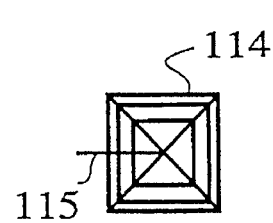
FIG.3A PRIOR ART   FIG.3B PRIOR ART

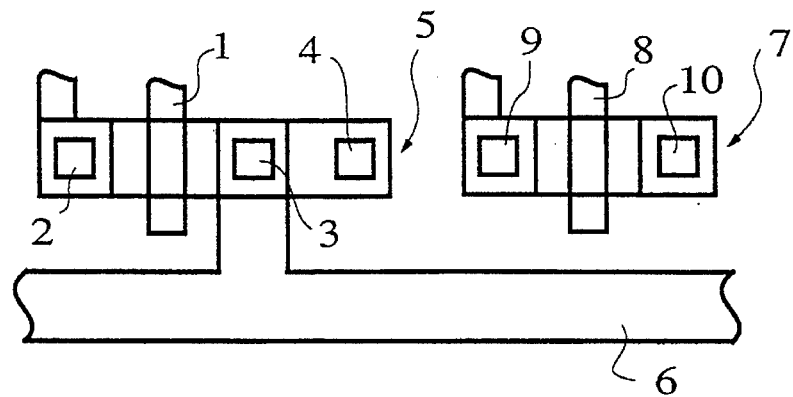
FIG.7A
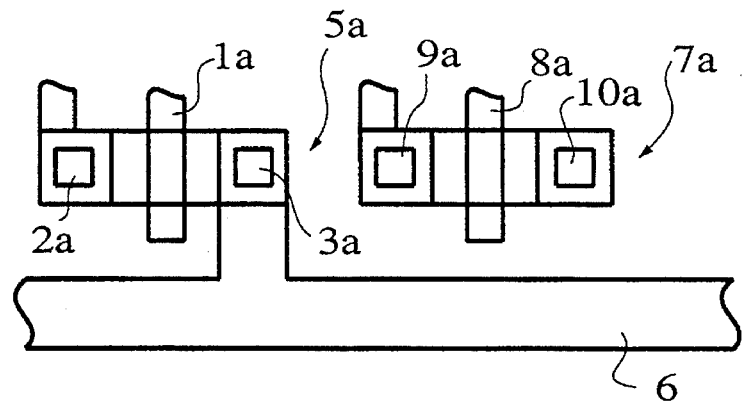
FIG.7B
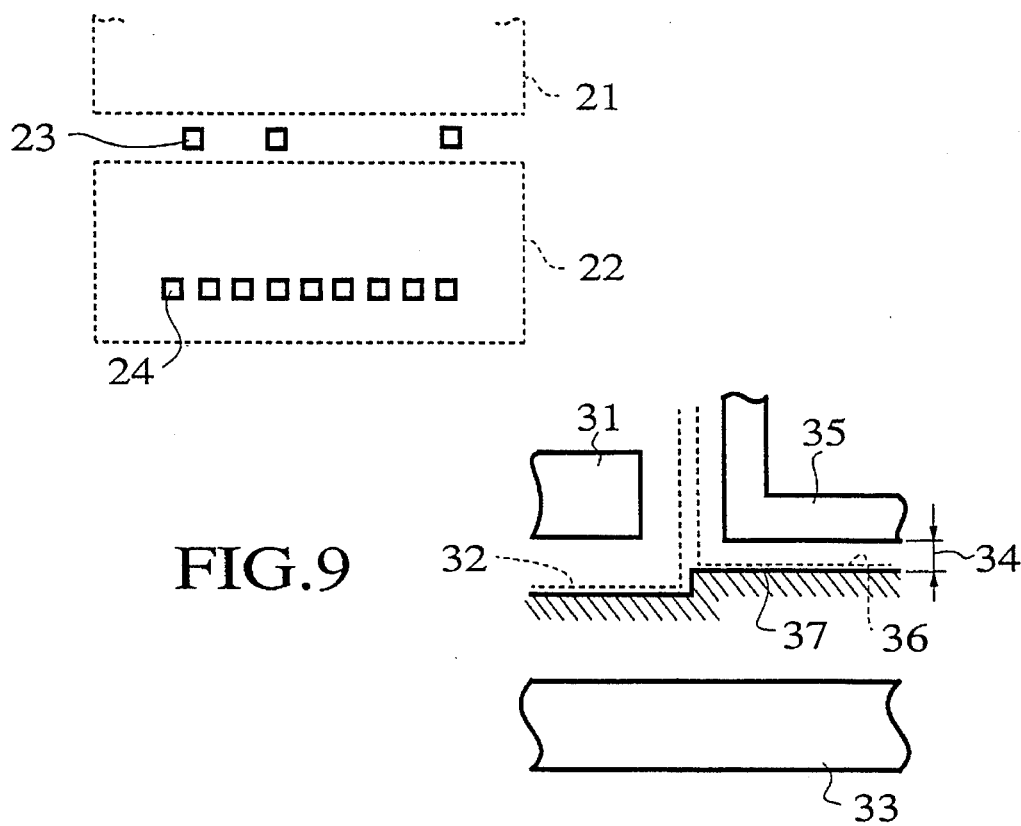
FIG.8
FIG.9

5,610,831

SEMICONDUCTOR ELEMENT LAYOUT METHOD EMPLOYING PROCESS MIGRATION

BACKGROUND OF THE INVENTION

1. Field of the Invention

The present invention relates to a semiconductor element layout method, and particularly, to a method of laying out contacts and substrate contacts through process migration to form a new mask layout according to existing layout resources.

2. Description of the Prior Art

Process migration involves scaling, layer operation, and compaction to convert an existing mask layout prepared for integrated circuits according to a design rule into a new mask layout that follows a different design rule. There are two methods to carry out the process migration.

One is a simple scaling method (hereinafter referred to as the first prior art). This method simply scales down an existing mask layout, grows or shrinks each layer of the scaled-down layout, and forms a new mask layout.

FIGS. 1A, 1B, and 1C show layouts according to the first prior art. Each layout involves a contact 111, a diffusion layer 112, and an aluminum layer 113. The contact 111 is a substrate contact, which is connected to substrate potential, e.g., grounding potential as shown in FIG. 2. The substrate contacts are properly arranged in a layout of semiconductor circuits, to stabilize the operation thereof.

The layout of FIG. 1A is an original mask layout including the substrate contact 111. The layout of FIG. 1B is formed by scaling down the layout of FIG. 1A at a magnification of 0.5. The layout of FIG. 1C is formed by growing only the substrate contact 111 of FIG. 1B.

The first prior art keeps the shapes and relative positions of elements before and after the process migration. For example, a first element on the right of a second element in an original layout is still on the right of the second element in a new layout.

The other method of achieving the process migration is a symbolic compactor method (hereinafter referred to as the second prior art). This method is disclosed in Japanese Laid-Open Patent Publication No. 63-159980. The second prior art forms a symbolic layout shown in FIG. 3A from an existing mask layout. The symbolic layout involves symbols that represent circuit elements. In FIG. 3A, a symbol 114 represents a substrate contact, and a straight segment symbol 115 represents an aluminum wiring layer. These symbols are simply scaled down, and spaces between the symbols are reduced by a symbolic compactor, to form a layout of FIG. 3B.

The second prior art sometimes changes the relative positions of elements and the shapes of wires before and after the process migration. Contacts and substrate contacts are unchanged before and after the process migration. If symbols overlap one upon another after the process migration, the second prior amalgamates the symbols and reduces the number thereof.

The first and second prior arts have the following problems:

(1) FIG. 4A shows an original mask layout, and FIG. 4B shows a new mask layout converted from the original mask layout according to the first or second prior art. The difference between the original and new layouts causes a loss area.

In FIG. 4A, an element region 121 is longer than a substrate contact 122, and an object 123 is adjacent to them. In FIG. 4B, a substrate contact 122a is longer than an element region 121a, and an object 123a is adjacent to them.

The difference between the layouts of the FIGS. 4A and 4B is caused by the difference between the design rules thereof. Compared with the original mask layout, the converted mask layout is narrower in gate intervals and wider in contact intervals. In FIG. 4B, it is impossible to move the object 123a to the left, to thereby produce a loss area, i.e., a dead space 124. The first prior art causes a larger loss area than the second prior art.

(2) The second prior art is superior to the first prior art in terms of the area loss. The second prior art, however, has a substrate contact problem.

To avoid the dead space caused by substrate contacts, it is preferable to neglect a contact spacing rule when carrying out symbolic compaction on a layout. Namely, it is preferable to carry out compaction without regard to a minimum spacing rule for contacts, if the contacts are in the same net, like substrate contacts connected to the same power source, because there will be no problem even if adjacent elements in the same net are short-circuited to each other. If a space narrower than a minimum space is produced by compaction, the space is closed later. This technique is effective to reduce a layout area.

This technique, however, raises a problem. In FIG. 5, substrate contacts 131 are too close to each other, and therefore, form an overlapped part 132. The overlapped part 132 violates a contact spacing rule or a contact minimum width rule. This violation corresponds to a DRC error occurring between objects in the same net. This sort of DRC error is one of the difficult problems of compaction, and there is no general solution for the problem. Most DRC errors in the same net are caused by violation of rules related to substrate contacts. A measure to cope with this problem is needed.

The most important issue in compaction is a large scale process. A practical solution for the large scale process is divisional compaction disclosed in Japanese Patent Application No. 4-253183. The divisional compaction divides a symbolic layout into sections, and compacts each of the sections. When dividing a symbolic layout into sections, the substrate contact problem occurs. The symbolic layout to be divided must have a space where neither contacts nor transistors are present. An area where circuit elements are formed has a sufficient space because the circuit elements are not always short-circuited to one another. An area where substrate contacts are formed, however, has no free space and is hardly divided into sections because the substrate contacts are usually arranged densely with no gap among them.

(3) When a layout is compacted without regard to a contact spacing rule, substrate contacts may overlap one upon another on the layout to cause a shortage of contact area. If a process vulnerable to a latch-up phenomenon is employed, the first and second prior arts will cause a shortage of substrate contacts.

(4) The first and second prior arts are not adaptable to new design rules.

SUMMARY OF THE INVENTION

An object of the present invention is to provide a mask layout method that greatly reduces a layout area.

Another object of the present invention is to provide a semiconductor element layout method that reduces a chip area without causing area loss intrinsic to process migration.

Still another object of the present invention is to provide a semiconductor element layout method that causes no design rule violation, is applicable to divisional compaction, and is operable with a symbolic compactor.

Still another object of the present invention is to provide a semiconductor element layout method that forms as many substrate contacts as possible in a dead space, avoids the overlapping of substrate contacts during compaction, and secures an area for substrate contacts.

Still another object of the present invention is to provide a semiconductor element layout method that is adaptable to new design rules and improves yield.

In order to accomplish the objects, the present invention provides a semiconductor element layout method involving the step of partly removing substrate contacts from a first mask layout prepared for integrated circuits according to a first design rule, and the step of carrying out process migration to convert the first mask layout into a second mask layout that follows a second design rule whose minimum spacing is smaller than that of the first design rule.

It is preferable to selectively remove substrate contacts that are present between adjacent elements.

It is preferable that the process migration step carries substrate contacts that are present in a space between dissimilar wells on the first mask layout into the second mask layout, and removes substrate contacts that are present in the wells on the first mask layout.

It is preferable that the process migration step removes substrate contacts that are on or attached to a power supply trunk on the first mask layout.

It is preferable that the process migration step removes substrate contacts that are adjacent to each other on the first mask layout.

It is preferable that the process migration step keeps substrate contacts that are indirectly connected to a power supply trunk through a layer that is different from the power supply trunk, and removes substrate contacts that are directly connected to the power supply trunk.

It is preferable to prepare a symbolic layout according to the substrate-contact-removed layout, and form substrate contacts on the symbolic layout.

It is preferable that the process migration step converts substrate contacts on the first mask layout into joint contacts on the second mask layout.

It is preferable that the process migration step converts substrate contacts on the first mask layout into butting contacts on the second mask layout.

It is preferable that the process migration step converts substrate contacts on the first mask layout into borderless contacts on the second mask layout.

It is preferable that the process migration step divides a contact cut of a substrate contact on the first mask layout into square contacts of uniform size on the second mask layout.

It is preferable that the process migration step removes substrate contacts from a power supply line on the first mask layout and converts the power supply line into a path of uniform thickness on the second mask layout.

It is preferable that the process migration step grows contacts, substrate diffusion layers, and layers to be short-circuited to them, obtains an OR region of these grown contacts and layers, obtains an ANDNOT region of the OR region and wells, removes a power source from a metal conductive layer, finds an inverted region of the power-source-removed metal conductive layer, scales down the inverted region by a predetermined value, finds an AND region of the ANDNOT region and the scaled-down inverted region, and forms substrate contacts in the AND region.

The second mask layout is preferably a symbolic layout.

The process migration substantially carries an arrangement of elements on the first mask layout onto the second mask layout. In particular, the relative positions of adjacent elements on the first mask layout are kept as they are on the second mask layout. Based on this characteristic, the process migration according to the present invention selectively removes substrate contacts between adjacent elements on the first mask layout.

Namely, the present invention keeps the vertical relationship between vertically adjacent elements such as elements 142 and 143 of FIG. 6, as well as the horizontal relationship between horizontally adjacent elements such as elements 141 and 142, and elements 141 and 143 of FIG. 6. There will be, however, exceptions if there are many dead spaces, or IO analog blocks.

The process migration of the present invention selectively removes substrate contacts on an original mask layout, so that no substrate contacts are present between two adjacent elements on a converted mask layout. In FIG. 6, the element 141 involves a left space 144, a lower space 145, a right space 146, and an upper space 147.

BRIEF DESCRIPTION OF THE DRAWINGS

FIGS. 1A, 1B, and 1C show the first prior art;

FIG. 2 is a sectional view showing a substrate contact;

FIGS. 3A and 3B show the second prior art;

FIGS. 7A and 7B show a semiconductor element layout method according to a first embodiment of the present invention;

FIG. 8 shows an original mask layout to be processed by a semiconductor element layout method according to a second embodiment of the present invention;

FIG. 9 explains a method of forming a substrate contact according to the second embodiment;

DETAILED DESCRIPTION OF THE EMBODIMENTS

Figure 4A:
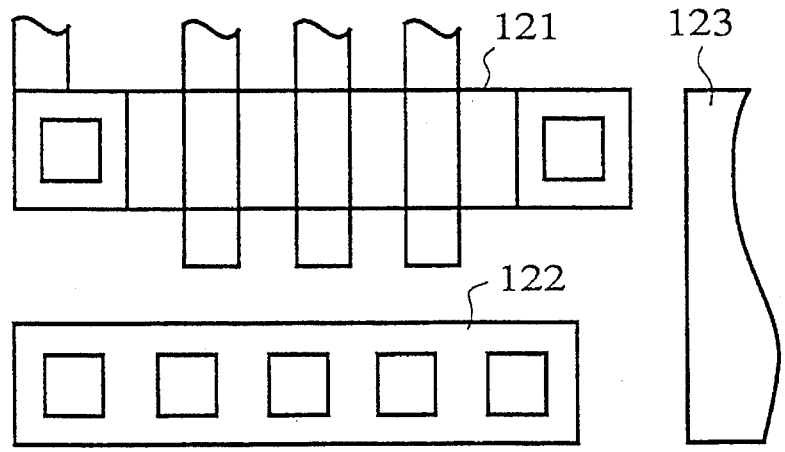
FIGS. 4A and 4B show a semiconductor element layout method according to a prior art.
Figure 4B:
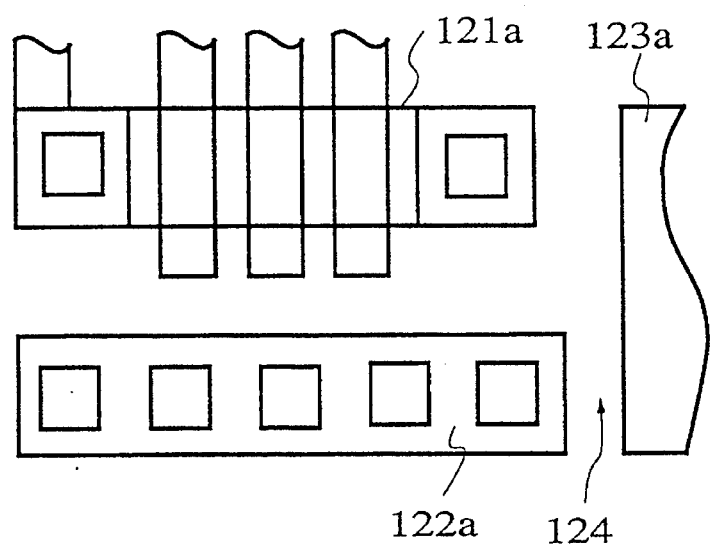
Figure 5:
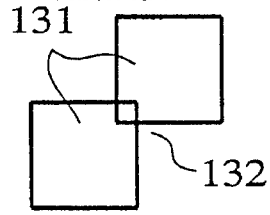
FIG. 5 explains the problem of the prior art.
Figure 6:
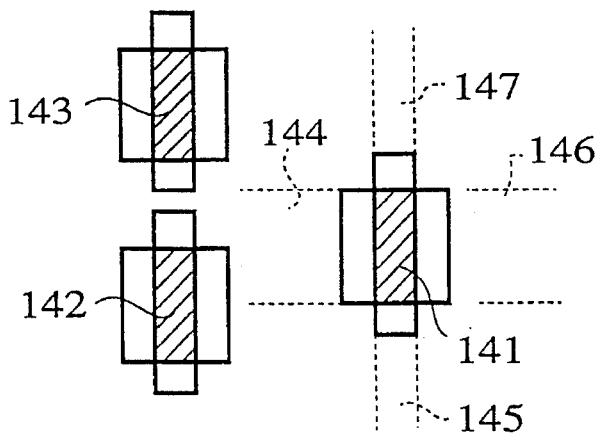
FIG. 6 explains the present invention.

The embodiments of the present invention will be explained with reference to the drawings.

FIGS. 7A and 7B show a semiconductor element layout method according to the first embodiment of the present invention. This method is achieved by a computer. FIG. 7A shows an original mask layout, and FIG. 7B shows a converted mask layout formed by process migration from the original mask layout.

The process migration involves scaling, layer operation, and compaction to be carried out on the original mask layout prepared for integrated circuits according to a design rule, to convert the original mask layout into the converted layout that follows another design rule. The layer operation involves AND, OR, ANDNOT, and GROW. The converted mask layout may be a symbolic layout.

The original layout of FIG. 7A includes a transistor 1 and diffusion contacts 2 and 3 disposed on each side of the transistor 1. A substrate contact 4 is arranged on the right of the diffusion contact 3. The transistor 1, diffusion contacts 2 and 3, and substrate contact 4 are in a region 5. A power supply line 6 is arranged under the region 5 and is connected to the diffusion contact 3. A region 7 is arranged on the right of the region 5 with a predetermined space between them. The region 7 includes a transistor 8 and diffusion contacts 9 and 10 that are arranged on each side of the transistor 8.

On the original mask layout of FIG. 7A, the substrate contact 4 is positioned between the transistor 1 in the left region 5 and the transistor 8 in the right region 7.

The converted mask layout of FIG. 7B is formed by the process migration according to the original mask layout of FIG. 7A. The substrate contact 4 is selectively removed from the converted mask layout. Accordingly, a space between transistors 1a and 8a on the converted mask layout is narrower than a space between the corresponding transistors 1 and 8 on the original mask layout. The design rule of the converted mask layout allows no substrate contact to be formed between the transistors 1a and 8a.

Converting the original mask layout into the converted mask layout will be explained.

Substrate contacts are selectively removed from the original mask layout, to form a symbolic layout. The substrate contacts are selectively removed according to a first design rule. Symbols on the symbolic layout are scaled according to the second prior art. The symbolic layout is then compacted with a symbolic compactor according to a second design rule whose minimum spacing is smaller than that of the first design rule. Substrate contacts are formed in a free space on the compacted layout, to form the converted mask layout.

Another technique of forming the converted mask layout from the original mask layout will be explained.

A symbolic layout is prepared according to the original mask layout. Symbols on the symbolic layout are selectively changed and replaced. Namely, substrate contacts are removed, and the other symbols are scaled according to the second prior art. Then, the symbolic layout is compacted with a symbolic compactor, to form the converted mask layout.

In this way, this embodiment selectively removes substrate contacts, to avoid dead spaces or chip area loss that usually occurs during the process migration.

FIG. 8 shows an original mask layout to be processed by a semiconductor element layout method according to the second embodiment of the present invention. FIG. 9 shows a technique of forming substrate contacts according to the second embodiment.

The original mask layout of FIG. 8 involves an N well 21 and a P well 22. Between the wells 21 and 22, substrate contacts 23 are arranged outside the wells 21 and 22. Substrate contacts 24 are arranged inside the P well 22.

This embodiment selectively removes the substrate contacts 24 when forming a converted mask layout. Namely, this embodiment removes the substrate contacts 24, forms a symbolic layout, and compacts the symbolic layout with a symbolic compactor. Thereafter, the embodiment newly forms substrate contacts in a free well space where there are no contacts, substrate diffusion layers, or layers to be short-circuited to these contacts and substrate diffusion layers. The formation of the new substrate contacts will be explained with reference to FIG. 9.

The free well space is obtained by finding an OR region (a diffusion region 31) of the contacts, substrate diffusion layers, and layers to be short-circuited to these contacts and substrate diffusion layers, grows the OR region by a predetermined value, and calculates an ANDNOT of the grown region and the well (the area shown in FIG. 9 is inside the well). A power source 33 is extracted (ANDNOT) from an aluminum layer. The power-source-extracted region is inverted and reduced by a minimum aluminum spacing 34, to obtain a lower right region along a boundary 36. Numeral 35 is an aluminum layer region excluding the power source. An AND region of the lower right region and the free region is obtained, and the AND region is reduced by a predetermined value and is grown to obtain a substrate contact forming region 37 in which a substrate diffusion layer is formed. An aluminum layer is formed in the substrate contact forming region 37, and the region 37 is reduced by a predetermined value. Thereafter, substrate contacts are formed in the reduced region.

The substrate contacts 23 are relatively small in numbers and are discrete, so that they do not cause the compaction problem. On the other hand, the substrate contacts 24 cause the compaction problem because they are large in numbers and concentrated. Unlike the contacts 23, the contacts 24 are not so important to prevent a latch-up phenomenon. It is effective, therefore, to remove the substrate contacts 24 before compaction.

This embodiment forms as many substrate contacts as possible in a free well space, i.e., a dead space after compaction, and never overlaps the substrate contacts one upon another during compaction. This embodiment secures a sufficient area for substrate contacts.

Figure 10:
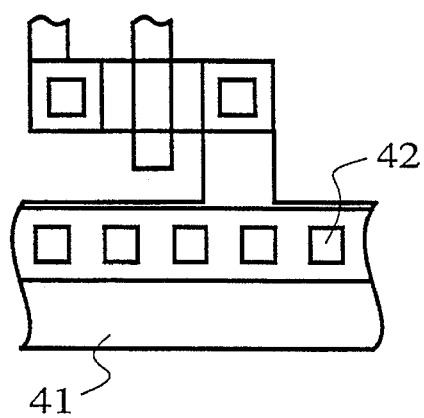
FIG. 10 shows an original mask layout to be processed by a semiconductor element layout method according to a third embodiment of the present invention.
Figure 11:
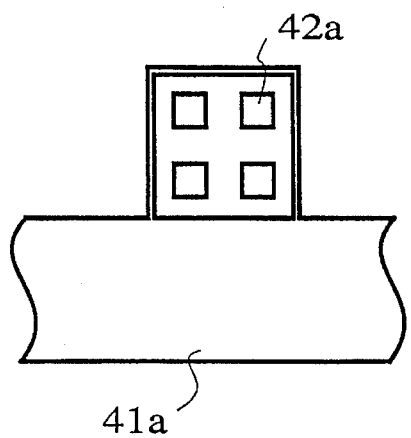
FIG. 11 shows an original mask layout to be processed by the third embodiment.

FIG. 10 shows an original mask layout to be processed by a semiconductor element layout method according to the third embodiment of the present invention, and FIG. 11 shows another original mask layout to be processed by this embodiment.

This embodiment selectively removes substrate contacts 42 on a power supply trunk 41 as shown in FIG. 10, or substrate contacts 42a attached to a power supply trunk 41a as shown in FIG. 11, to form a converted mask layout.

Namely, this embodiment selectively removes the substrate contacts 42 and 42a, to form a symbolic layout, and compacts the symbolic layout with a symbolic compactor. Thereafter, the embodiment forms substrate contacts in a free space in the same manner as the second embodiment.

The substrate contacts 42 on the power supply trunk 41, or the substrate contacts 42a attached to the power supply trunk 41a are large in numbers and concentrated to cause the compaction problem. Accordingly, it is advantageous to remove such substrate contacts before compaction.

Figure 12:
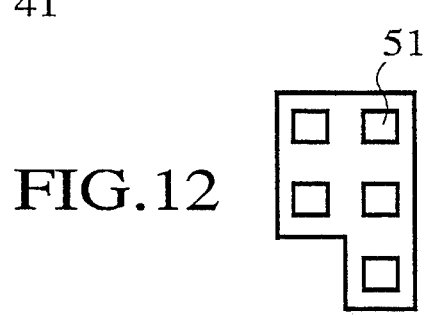
FIG. 12 shows an original mask layout to be processed by a semiconductor element layout method according to a fourth embodiment of the present invention.

FIG. 12 shows an original mask layout to be processed by a semiconductor element layout method according to the fourth embodiment of the present invention.

This embodiment selectively removes substrate contacts 51 that are closely and densely arranged and keeps a discrete substrate contact 52. Namely, this embodiment removes the substrate contacts 51 from the original mask layout, to form a symbolic layout, and compacts the symbolic layout with a symbolic compactor. Thereafter, the embodiment forms substrate contacts in a free space in the same manner as the second embodiment.

The concentrated substrate contacts 51 easily cause the compaction problem. Accordingly, it is effective to remove these substrate contacts before compaction.

Figure 13:
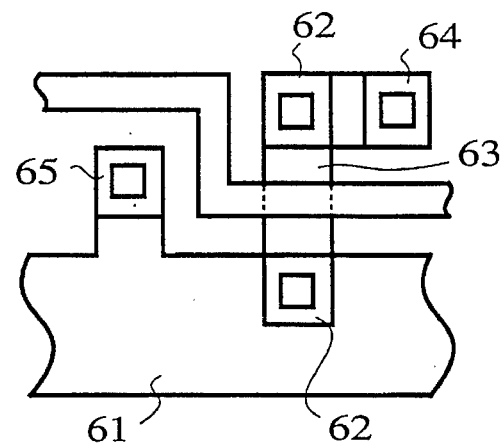
FIG. 13 shows an original mask layout to be processed by a semiconductor element layout method according to a fifth embodiment of the present invention.

FIG. 13 shows an original mask layout to be processed by a semiconductor element layout method according to the fifth embodiment of the present invention. This embodiment keeps a substrate contact 64 indirectly connected to a power supply trunk 61 through a contact 62 and a wiring layer 63, and selectively removes a substrate contact 65 directly connected to the power supply trunk 61.

Namely, this embodiment removes the substrate contact 65 from the original mask layout, to form a symbolic layout, and compacts the symbolic layout with a symbolic compactor. Thereafter, the embodiment forms substrate contacts in a free space in the same manner as the second embodiment.

The substrate contact 64 is effective to prevent a latch-up phenomenon. A power supply line is usually positioned inside a well, and arranging an element away from the power supply line is effective to prevent the latch-up phenomenon. This is the reason why a substrate contact such as the substrate contact 64 is needed. It is impossible to form the substrate contact 64 according to the second embodiment. Accordingly, the substrate contact 64 is kept, and the substrate contact 65 is removed before compaction.

Figure 14A:
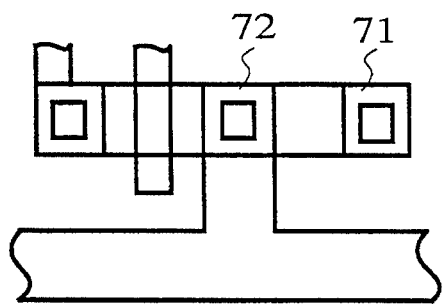
FIGS. 14A and 14B show a semiconductor element layout method according to a sixth embodiment of the present invention.
Figure 14B:
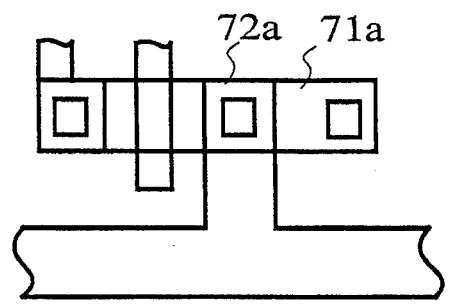

FIG. 14A shows an original mask layout to be processed by a semiconductor element layout method according to the sixth embodiment of the present invention, and FIG. 14B shows a converted mask layout formed by process migration based on the original mask layout.

Referring to FIG. 14A, a substrate contact 71 on the original mask layout is not directly connected to a dissimilar diffusion contact 72. A substrate contact 71a on the converted mask layout of FIG. 14B is directly connected to an adjacent diffusion contact 72a. Namely, the contacts 71a and 72a are joint contacts. The joint contacts are advantageous in saving a space and preventing the latch-up phenomenon.

Reducing an area by employing joint contacts is particularly effective for the process migration. When a layout is scaled down step by step, design rules for the steps are not always scaled down accordingly. For example, a space between a diffusion layer and a substrate diffusion layer is sometimes increased during the scaling down.

As explained above, the process migration carries an arrangement of elements on an original mask layout onto a converted mask layout. Accordingly, the original mask layout must be wholly expanded to keep a spacing rule between a diffusion layer and a substrate diffusion layer on the layout. This is particularly required by the simple scaling method. This expansion is not required if substrate contacts are changed into joint contacts. The joint contacts, therefore, prevent an increase in the area and cost of a layout.

Figure 15A:
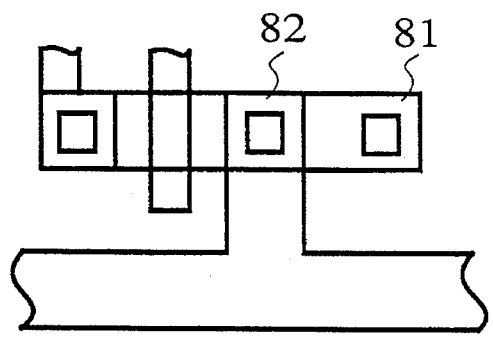
FIGS. 15A and 15B show a semiconductor element layout method according to a seventh embodiment of the present invention.
Figure 15B:
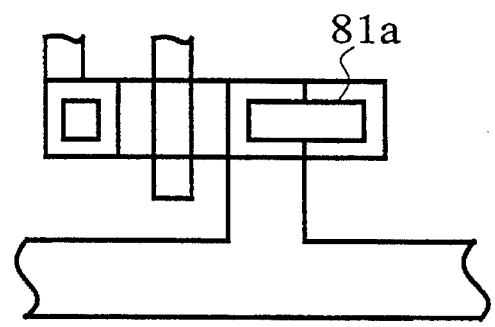

FIG. 15A shows an original mask layout to be processed by a semiconductor element layout method according to the seventh embodiment of the present invention, and FIG. 15B shows a converted mask layout formed by process migration based on the original mask layout.

A contact cut of a substrate contact 81 of FIG. 15A is not integral with a contact cut of an adjacent diffusion contact 82. Accordingly, they are not butting contacts irrespective of whether or not they form joint contacts.

A contact cut of a substrate contact 81a of FIG. 15B after process migration is integral with a contact cut of an adjacent diffusion contact, to form butting contacts.

The butting contacts of FIG. 15B are usually smaller than the contacts of FIG. 15A, if they are processed according to the same technical level. As explained with reference to the joint contacts of the sixth embodiment, reducing an area with use of the butting contacts is particularly effective for process migration.

Figure 16:
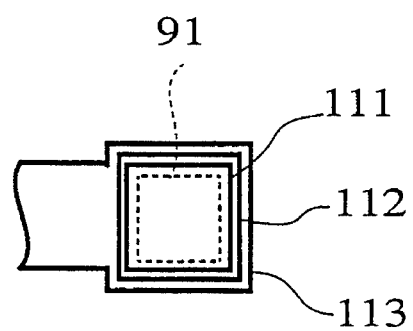
FIG. 16 shows a semiconductor element layout method according to an eighth embodiment of the present invention.

FIG. 16 shows a converted mask layout formed from the original mask layout of FIG. 1A, by a semiconductor element layout method according to the eighth embodiment of the present invention. The same reference marks as those of FIG. 1 represent like parts.

The embodiment of FIG. 16 employs a borderless technique, so that an aluminum layer 113 and a substrate diffusion layer 112 have no margin for a contact 111. The borderless technique needs a buried layer 91 made from, for example, tungsten, to carry out a flattening burying process. A borderless contact provides an area reducing effect, and reducing an area is particularly effective for process migration, similar to the joint contacts of the sixth embodiment.

Figure 17A:
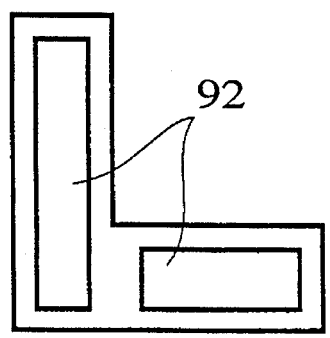
FIGS. 17A and 17B show a semiconductor element layout method according to a ninth embodiment of the present invention.
Figure 17B:
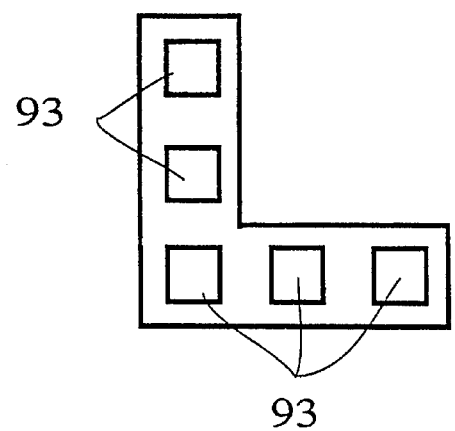

FIG. 17A shows an original mask layout to be processed by a semiconductor element layout method according to the ninth embodiment of the present invention, and FIG. 17B shows a converted mask layout formed by process migration according to the original mask layout.

In FIG. 17A, a contact cut 92 of a substrate contact is rectangular and is not of minimum size. On the other hand, a contact cut 93 of a substrate contact after the process migration is square and has minimum size.

Figure 18A:
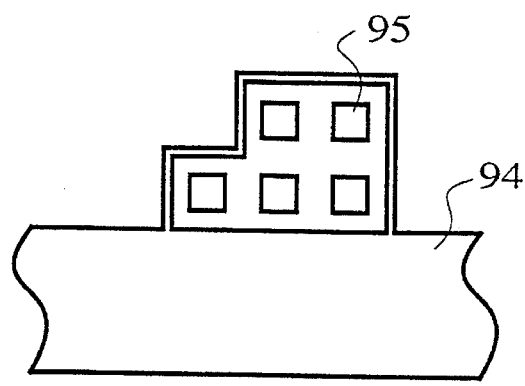
FIGS. 18A and 18B show a semiconductor element layout method according to a 10th embodiment of the present invention.
Figure 18B:
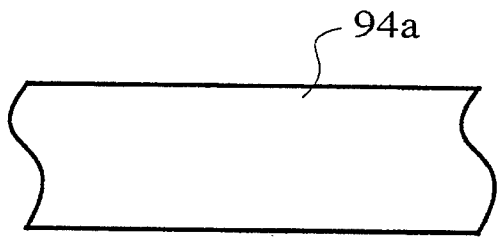
Figure 19:
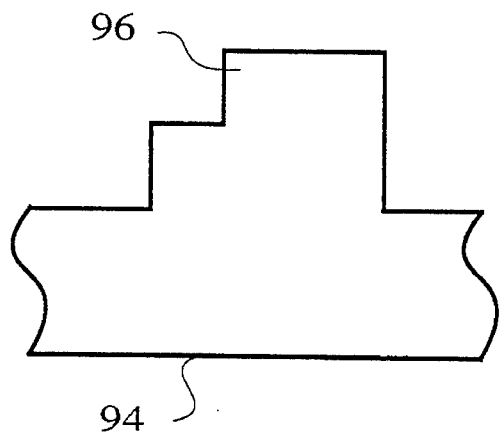
FIG. 19 explains the 10th embodiment.
Figure 20:
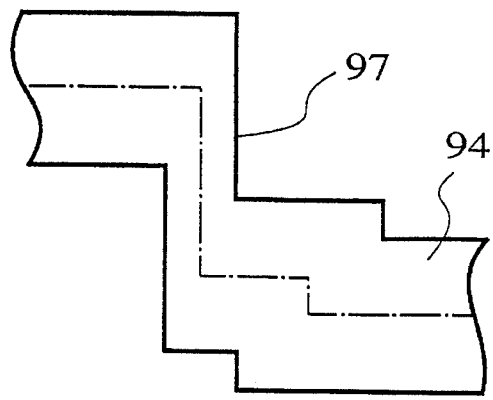
FIG. 20 explains the 10th embodiment.

FIG. 18A shows an original mask layout to be processed by a semiconductor element layout method according to the 10th embodiment of the present invention, and FIG. 18B shows a converted mask layout formed by process migration according to the original mask layout. When substrate contacts 95 on a power supply line 94 are removed, a projection 96 is formed on the power supply line 94 as shown in FIG. 19. If the projection 96 is left as it is to form a symbolic layout, and if the symbolic layout is compacted, a layout of FIG. 20 will be formed. The layout of FIG. 20 has a thin section 97 in the power supply line 94. In addition, the power supply line 94 is bent, and the positional relationships of elements around the power supply line 64 differ before and after the process migration.

Accordingly, the 10th embodiment corrects the power supply line 94 having the projection 96 of FIG. 19 into a straight power supply line 94a of FIG. 18B. The layout of FIG. 18B has no thin section 97 of FIG. 20.

As explained above, the present invention removes substrate contacts before compaction if the removal of them causes no inconvenience.

A technique of processing substrate contacts by a computer will be explained.

Removing, for example, the substrate contacts 24 of FIG. 8 will be explained. The P well is expressed as Pwell, and a P+ diffusion layer pattern corresponding to a substrate contact is expressed as Psub. The computer carries out the following operation:

DMY1=NOT(Psub, Pwell)

DEL Psub

Psub<=DMY1

The first line defines DMY1 as Psub that is not Pwell. The second line removes the Psub. The third line substitutes the DMY1 for the Psub. As a result, substrate contacts outside the P well that are important for preventing the latch-up phenomenon are left as they are.

A technique of removing many substrate contacts arranged on or around a power supply line will be explained.

DMY1=grow(AL1, −10)

DMY2=grow(DMY1, 10)

DMY3=NOT(Psub, DMY2)

DEL Psub

Psub<=DMY3

Various modifications will become possible for those skilled in the art after receiving the teachings of the present disclosure without departing from the scope thereof.

What is claimed is:

1. A semiconductor element layout method comprising the steps of:

selectively removing substrate contacts from a first mask layout prepared for integrated circuits according to a first design rule which requires at least a first minimum spacing between the substrate contacts; and carrying out process migration to convert the first mask layout, from which some of said substrate contacts have been removed, into a second mask layout that follows a second design rule which requires at least a second minimum spacing that is smaller than the first minimum spacing of the first design rule.

2. The method as claimed in claim 1, further comprising the step of selectively removing substrate contacts that are present between adjacent elements.

3. The method as claimed in claim 2, wherein the process migration step carries substrate contacts that are present in a space between dissimilar wells on the first mask layout into the second mask layout, and removes substrate contacts that are present in the wells on the first mask layout.

4. The method as claimed in claim 2, wherein the process migration step removes substrate contacts that are on or attached to a power supply trunk on the first mask layout.

5. The method as claimed in claim 2, wherein the process migration step removes substrate contacts that are adjacent to each other on the first mask layout.

6. The method as claimed in claim 2, wherein the process migration step keeps substrate contacts that are indirectly connected to a power supply trunk through a layer that is different from the power supply trunk, and removes substrate contacts that are directly connected to the power supply trunk.

7. The method as claimed in claim 2, wherein the process migration step converts substrate contacts on the first mask layout into Joint contacts on the second mask layout.

8. The method as claimed in claim 2, wherein the process migration step converts substrate contacts on the first mask layout into butting contacts on the second mask layout.

9. The method as claimed in claim 2, wherein the process migration step converts substrate contacts on the first mask layout into borderless contacts on the second mask layout.

10. The method as claimed in claim 2, wherein the process migration step divides a substrate contact on the first mask layout into square contacts of uniform size.

11. The method as claimed in claim 2, wherein the process migration step removes substrate contacts from a power supply line on the first mask layout and converts the power supply line into a path of uniform thickness on the second mask layout.

12. The method as claimed in claim 2, wherein the process migration step grows contacts, substrate diffusion layers, and layers to be short-circuited to them, obtains an OR region of these grown contacts and layers, obtains an AND-NOT region of the OR region and wells, removes a power source from a metal conductive layer, inverts the power-source-removed metal conductive layer, scales down the inverted region by a predetermined value, finds an AND region of the ANDNOT region and the scaled-down inverted region, and forms substrate contacts in the AND region.

13. The method as claimed in claim 1, further comprising the step of preparing a symbolic layout according to the the first mask layout with the selectively removed substrate contacts, and forming substrate contacts on the symbolic layout.

14. The method as claimed in claim 1, wherein the second mask layout is a symbolic layout.

15. A semiconductor element layout method comprising the steps of:

selectively removing substrate contacts from a first mask layout prepared for integrated circuits according to a first design rule which requires at least a first minimum width for each of the substrate contacts; and carrying out process migration to convert the first mask layout, from which some of said substrate contacts have been removed, into a second mask layout that follows a second design rule which requires at least a second minimum width for the substrate contacts that is less that the first minimum width of the first design rule.

16. The method as claimed in claim 15, further comprising the step of selectively removing the substrate contacts that are present between adjacent elements.

17. The method as claimed in claim 16, wherein the process migration step carries substrate contacts that are present in a space between dissimilar wells on the first mask layout into the second mask layout, and removes substrate contacts that are present in the wells on the first mask layout.

18. The method as claimed in claim 16, wherein the process migration step keeps substrate contacts that are indirectly connected to a power supply trunk through a layer that is different from the power supply trunk, and removes substrate contracts that are directly connected to the power supply trunk.

19. The method as claimed in claim 16, wherein the process migration step converts substrate contacts on the first mask layout into joint contacts on the second mask layout.

20. The method as claimed in claim 16, wherein the process migration step converts substrate contacts on the first mask layout into butting contacts on the second mask layout.

\* \* \* \* \*